(12) United States Patent
Shieh et al.

(10) Patent No.: US 8,846,490 B1
(45) Date of Patent: Sep. 30, 2014

(54) METHOD OF FABRICATING A FINFET DEVICE

(71) Applicant: Taiwan Semiconductor Manufactuing Company, Ltd., Hsin-Chu (TW)

(72) Inventors: Ming-Feng Shieh, Yongkang (TW); Chen-Yu Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/871,644

(22) Filed: Apr. 26, 2013

Related U.S. Application Data

(60) Provisional application No. 61/777,083, filed on Mar. 12, 2013.

(51) Int. Cl.
*H01L 21/76* (2006.01)
*H01L 29/06* (2006.01)
*H01L 21/308* (2006.01)

(52) U.S. Cl.
CPC ............... *H01L 29/06* (2013.01); *H01L 21/76* (2013.01); *H01L 21/308* (2013.01)
USPC ........... 438/424; 438/427; 257/499; 257/506; 257/E21.548

(58) Field of Classification Search
CPC ....... H01L 21/308; H01L 21/76; H01L 29/06; H01L 29/66545; H01L 29/66795; H01L 29/785
USPC ........... 438/424, 427; 257/499, 506, E21.548
See application file for complete search history.

(56) References Cited

U.S. PATENT DOCUMENTS

| | | | |
|---|---|---|---|
| 7,829,951 B2 * | 11/2010 | Song et al. | 257/365 |
| 7,862,962 B2 | 1/2011 | Shieh et al. | |
| 7,989,355 B2 | 8/2011 | Shieh et al. | |
| 8,039,179 B2 | 10/2011 | Shieh et al. | |
| 8,110,466 B2 | 2/2012 | Shieh et al. | |
| 8,241,823 B2 | 8/2012 | Shieh et al. | |

* cited by examiner

*Primary Examiner* — Tu-Tu Ho
(74) *Attorney, Agent, or Firm* — Haynes and Boone, LLP

(57) ABSTRACT

A method of forming a fin structure of a semiconductor device includes providing a substrate, creating a mandrel pattern over the substrate, depositing a first spacer layer over the mandrel pattern, and removing portions of the first spacer layer to form first spacer fins. The method also includes performing a first fin cut process to remove a subset of the first spacer fins, depositing a second spacer layer over the un-removed first spacer fins, and removing portions of the second spacer layer to form second spacer fins. The method further includes forming fin structures, and performing a second fin cut process to remove a subset of the fin structures.

20 Claims, 11 Drawing Sheets

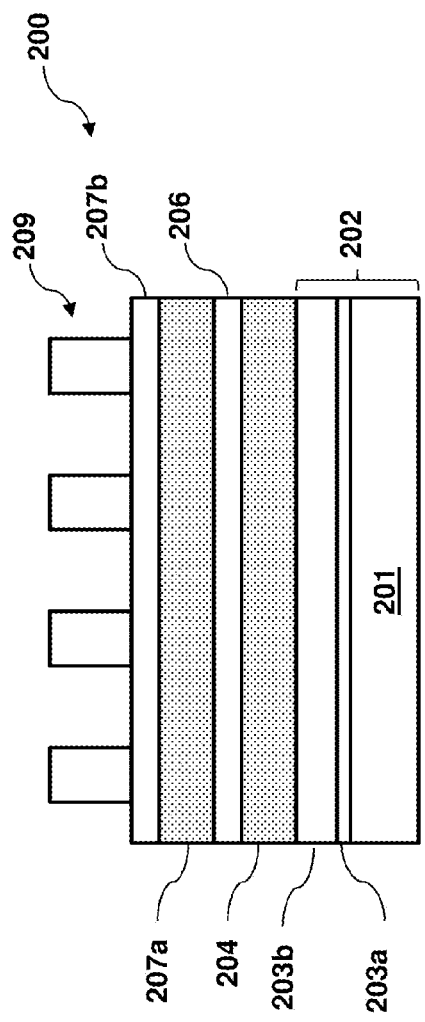
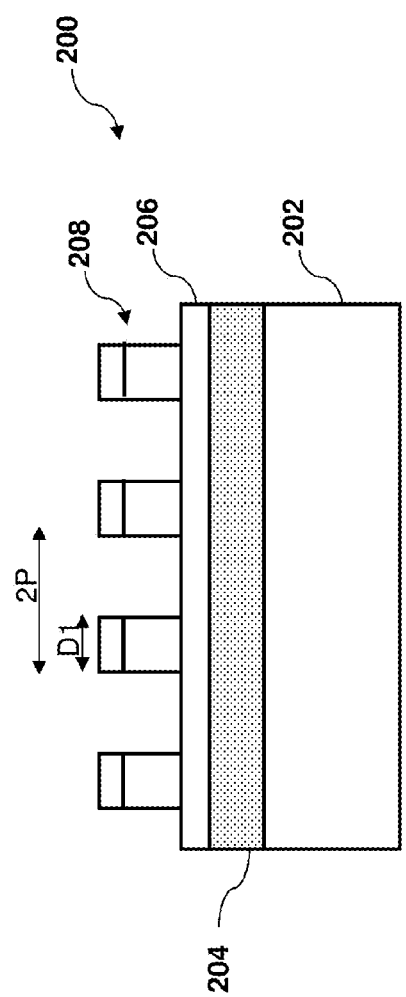

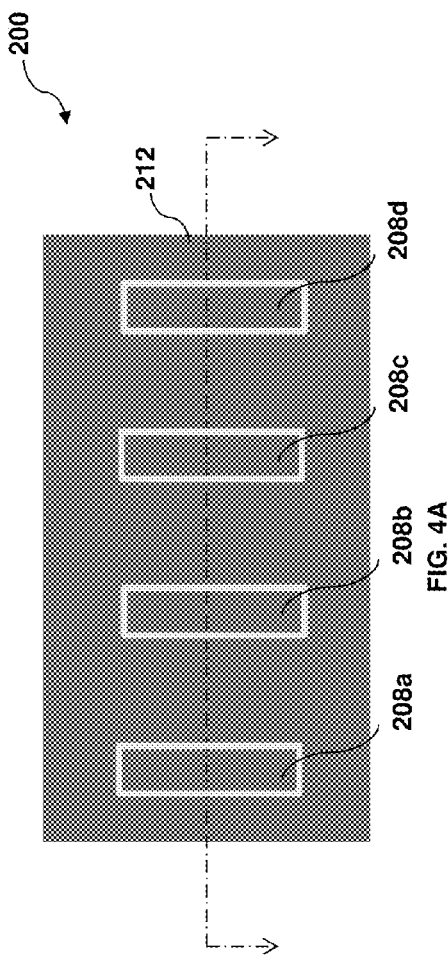
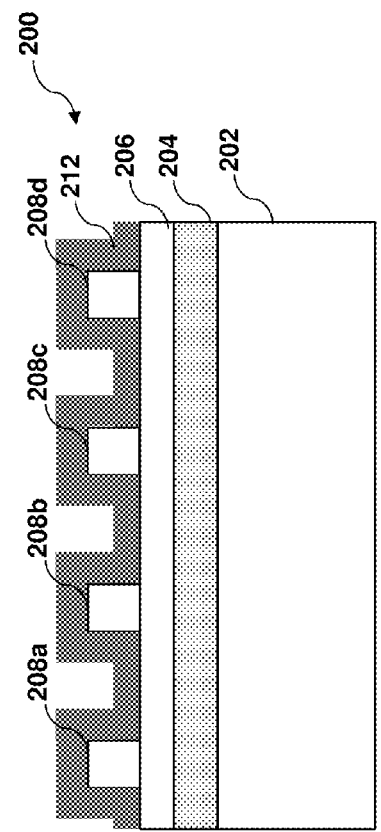
FIG. 4A
FIG. 4B

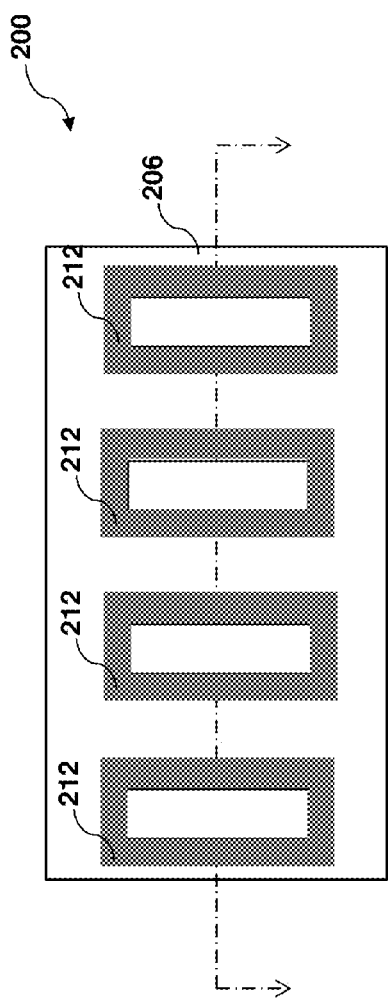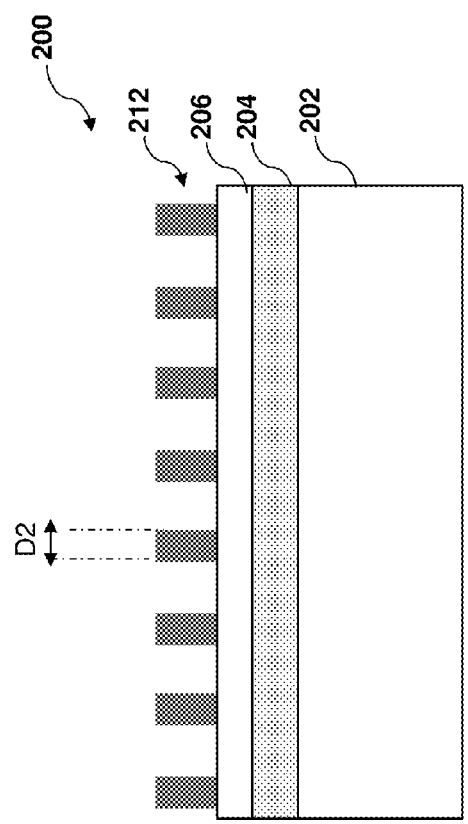
FIG. 5A
FIG. 5B

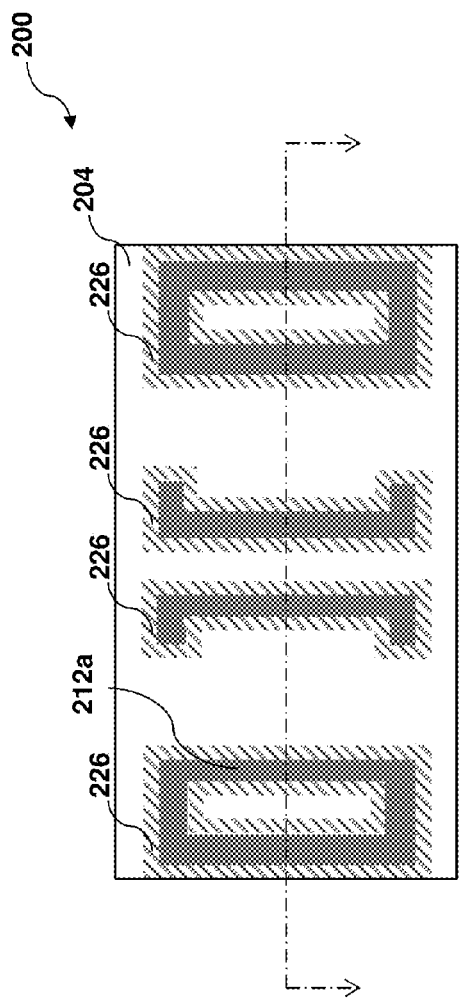
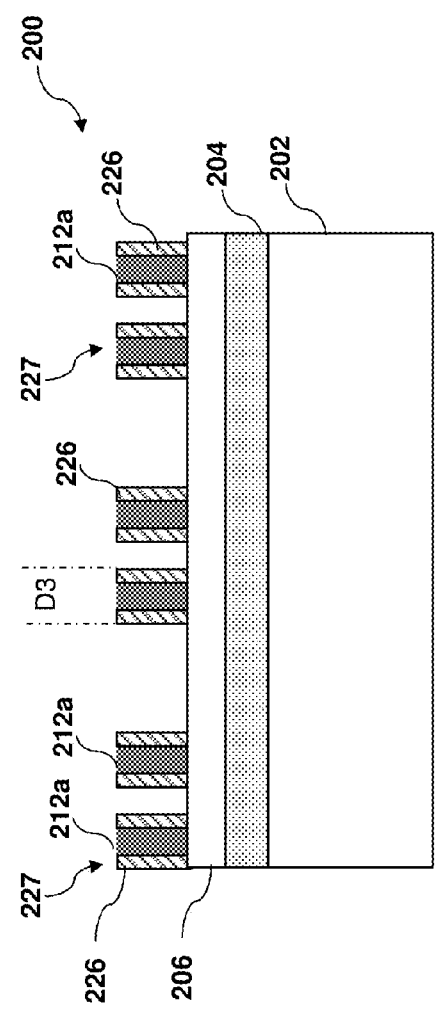

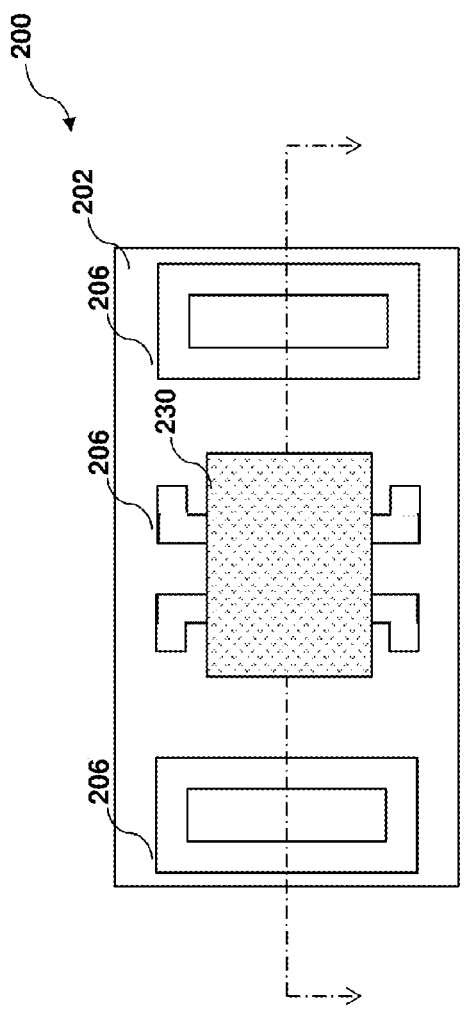
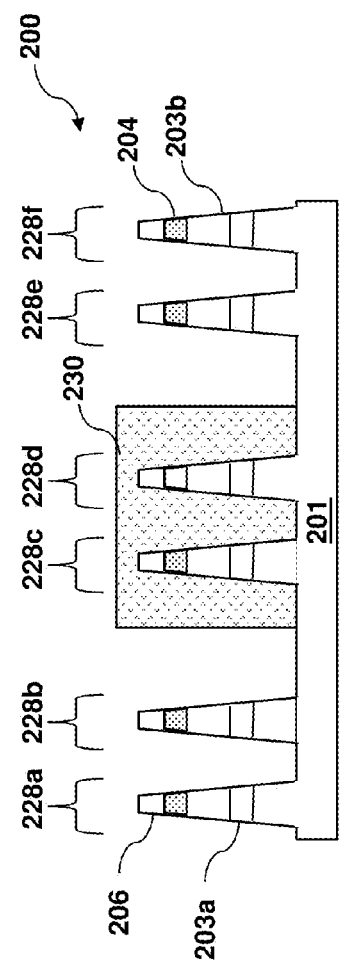
FIG. 10A
FIG. 10B

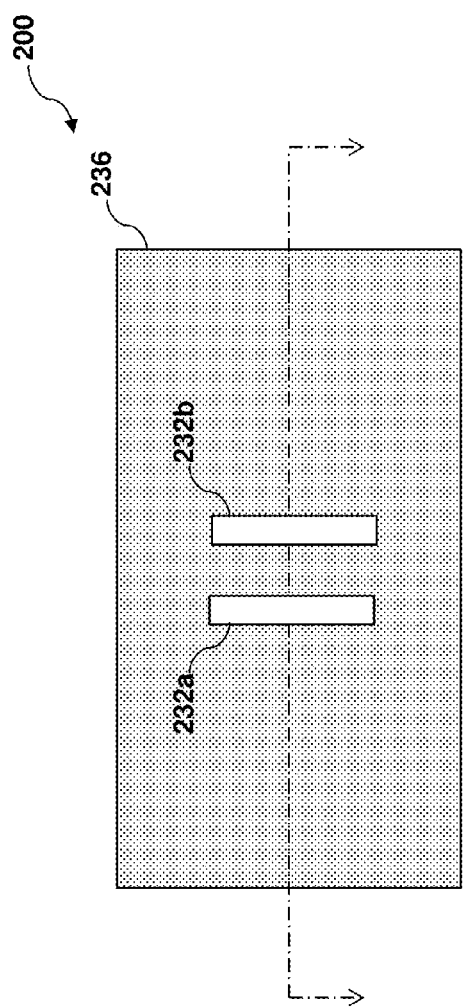
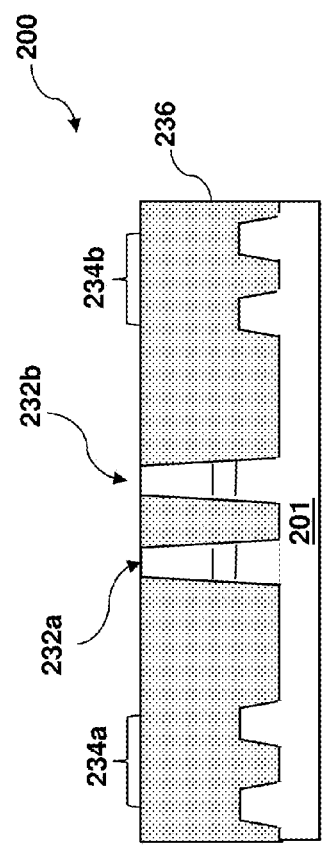
FIG. 12A
FIG. 12B

METHOD OF FABRICATING A FINFET DEVICE

The present patent claims the benefit of U.S. Ser. No. 61/777,083 filed Mar. 12, 2013, the disclosure of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of device is scaled down, an overlay error margin is also reduced when performing a fin cut process while fabricating a fin field effect transistor (FinFET) device. The reduced overlay error margin becomes increasing difficult to manage. Accordingly, what is needed is a method for performing the fin cut process within the overlay error margin.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 2-12B are top and cross sectional views of an example device being fabricated according to the method of FIG. 1.

DETAILED DESCRIPTION

Figure 1:
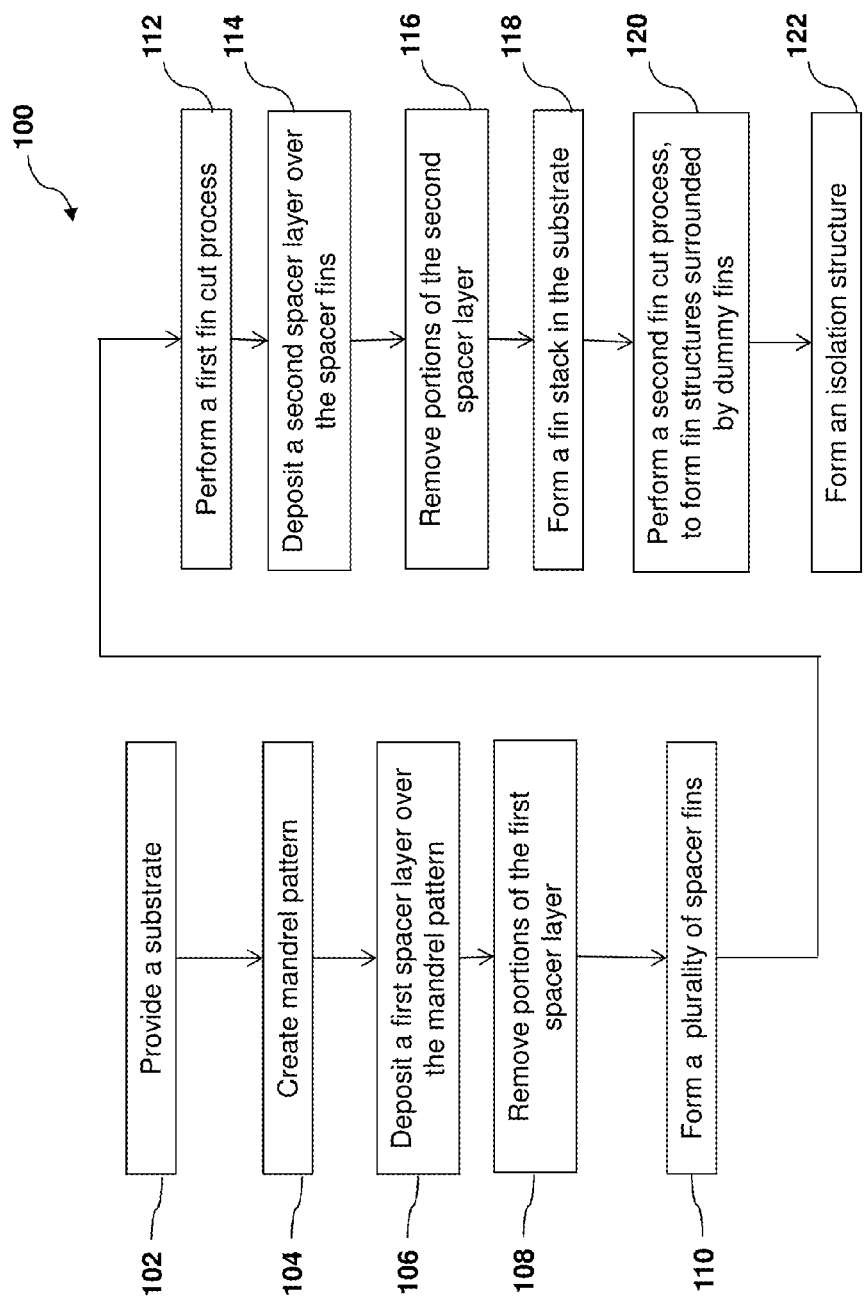
FIG. 1 is a flow chart of a method of fabricating a device for implementing one or more embodiments of the present invention.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a flow chart of a method 100 for fabricating a device is illustrated. It is understood that additional steps can be provided before, during, and after the method 100, and some steps described can be replaced, eliminated, or moved around for additional embodiments of the method. The method 100 will be further described below, and more specific embodiments of forming an example device 200, as shown in FIGS. 2-12B. The method 100 is an example, and is not intended to limit the present disclosure beyond what is explicitly recited in the claims.

The method 100 begins at step 102 by providing a substrate. Referring to FIG. 2, the device 200 includes a semiconductor layer 201, a pad oxide layer 203a, a silicon nitride (SiN) layer 203b, a first amorphous carbon (APF) layer 204, a first capping layer 206, a second APF layer 207a, and a second capping layer 207b. The layers 201, 203a, and 203b will be collectively referred to as base substrate 202.

In the present embodiment, the semiconductor layer 201 is a silicon wafer. Alternatively or additionally, the semiconductor layer 201 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some embodiments, the layer 201 may include a plurality of layers. The plurality of layers may include a conducting layer, a dielectric layer, or combination thereof. In one embodiment, the dielectric layer includes silicon oxide, silicon nitride, or silicon oxynitride (SiON). In another embodiment, the dielectric layer may include other suitable high-k or low-k dielectric material. In one example, the plurality of layers includes a pad silicon oxide layer, a silicon nitride layer, an amorphous carbon (APF) layer, and a silicon oxynitride layer.

The capping layers 206, 207b may be formed of various materials, such as SiON. Also, the capping layer 206 may include a different material than layer 207b, and the first amorphous silicon layer 204 may include a different material than layer 207a. Different materials support different etch selectivities, which can be used in one or more embodiments discussed below.

The method 100 proceeds to step 104 by creating a mandrel pattern over the device. Referring to FIG. 2, the device 200 includes a dummy mandrel 209, also referred to as a sacrificial mandrel. In the present embodiment, the dummy mandrel 209 is a hard mask. The hard mask may include materials such as silicon oxide, silicon nitride, or silicon oxynitride. Other suitable materials are possible. One way of forming the hard mask includes using a deposition process, such as a CVD or a PVD process, and a patterning process, such as photolithography.

In the present embodiments, the dummy mandrel pattern 209 is used as a hard mask to etch the second capping layer 207b and the second APF layer 207a to form a mandrel pattern 208, as shown in the FIG. 3. Various types of etchant processes may be used, including wet etch or dry etch. Each of the mandrel patterns 208 has a first dimension D1 and a first pitch 2P.

The method 100 proceeds to step 106 by depositing a first spacer layer over the mandrel patterns. Referring now to FIGS. 4A (top view) and 4B (cross section view), a first spacer layer 212 is deposited over the mandrel patterns 208 (individually designated 208a-d) formed over the first capping layer 206. The first spacer layer 212 may include a dielectric material, such as silicon oxide, silicon nitride, or silicon oxynitride. Forming the first spacer layer 212 includes using a deposition process, such as a CVD or a PVD process.

The method 100 proceeds to step 108 by removing portions of the first spacer layer. In one embodiment, this is done by performing an anisotropic etch process so that the first spacer layer only remains on sidewalls of the hard mask pattern. Referring now to FIGS. 5A (top view) and 5B (cross sectional view), portions of the first spacer layer 212 disposed over top of the hard mask patterns 208a-d are removed, portions of the first spacer layer 212 disposed over the surface of the capping layer 206 are also removed, and the first spacer layer 212 only remains on sidewalls of the hard mask patterns 208a-d. In the present embodiment, removing portions of the first spacer layer 212 includes using a plasma etching process.

The method 100 proceeds to step 110, where a plurality of spacer fins are formed. As shown in FIGS. 5A and 5B, the mandrel 209 is removed. This can be done by one or more conventional processes, such as wet etch, and dry etch. Also or in the alternative, the material used in layers 207a and 207b can be specified such that a selective dry etch would remove the mandrels 209 and portions of the first spacer 212 (leaving the material on the sidewalls), but not the layer 206. As a result, only patterned portions of the spacer layer 212 remain. The patterned spacers 212 are referred to as spacer fins, and have a dimension D2 that is less than D1 (FIG. 3).

Figure 6A:
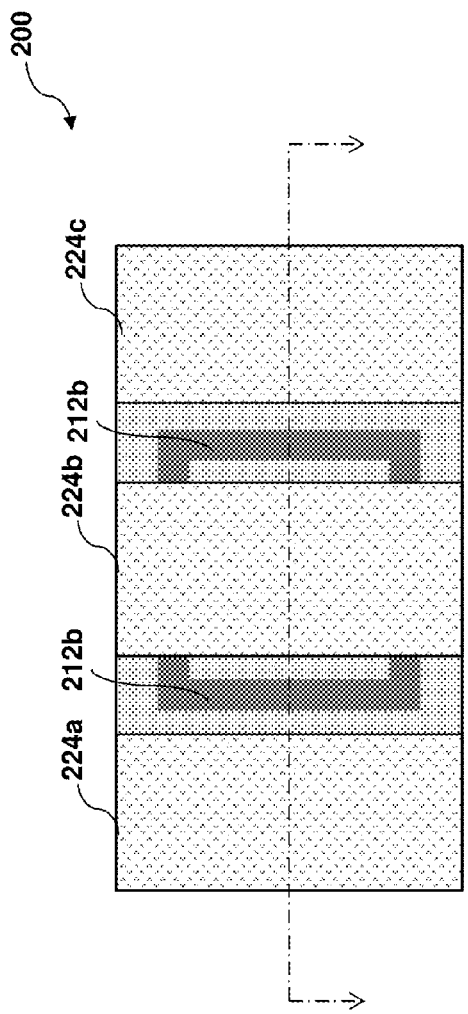
Figure 6B:
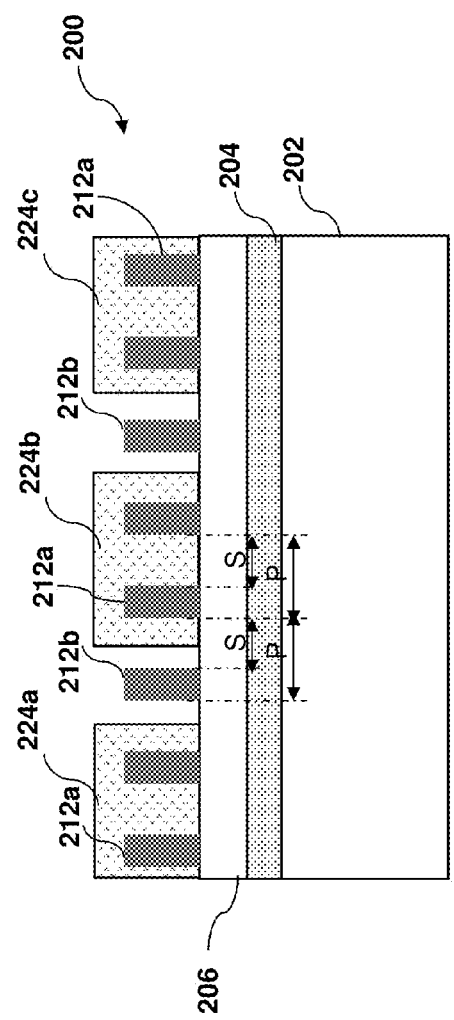
Figure 7A:
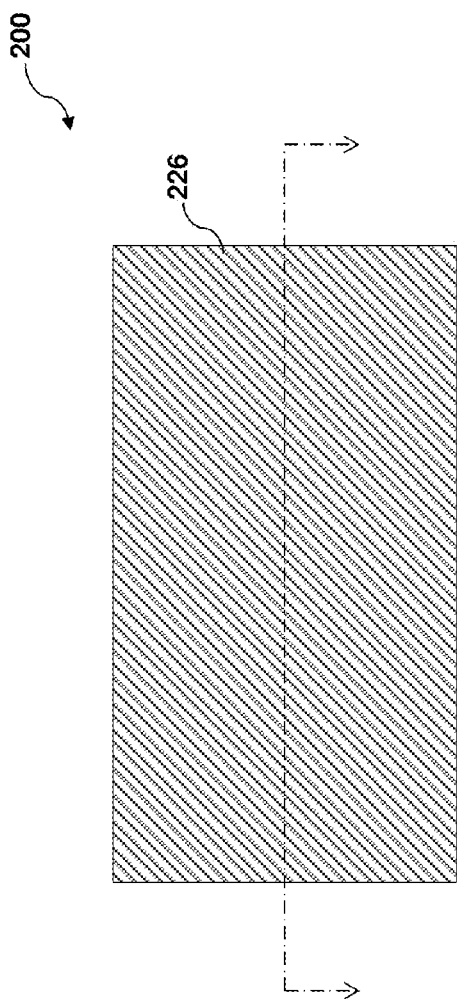
Figure 7B:
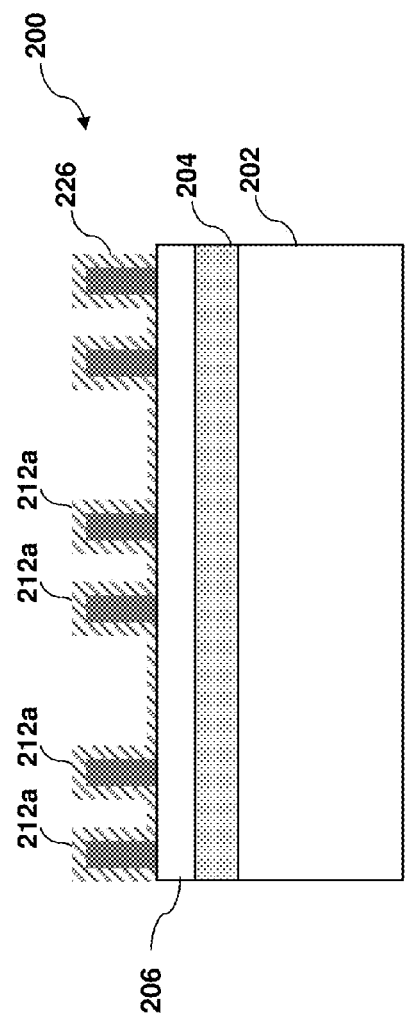

The method 100 proceeds to step 112 by performing a first fin cut process. Referring now to FIGS. 6A (top view) and 6B (cross sectional view), a first resist pattern 224a is formed to protect the spacer fins on the left side of the figure; a first resist pattern 224b is formed to protect the spacer fins in the middle of the figure; and a first resist pattern 224c is formed to protect the spacer fins on the right side of the figure. The protected spacer fins are designated 212a, and the remaining un-protected fins are designated 212b. As shown in FIG. 7B, in one embodiment, the unprotected fins 212b are cut or removed in the first fin cut process, such as by using an etch process.

The method 100 proceeds to step 114 by depositing a second spacer layer over the substrate and the spacer fins 212a. Referring now to FIG. 7A (top view) and 7B (cross sectional view), a second spacer layer 226 is deposited over the spacer fins 212a and the first capping layer 206. In the present embodiments, the second spacer layer 226 includes a second thickness used to compensate the intentionally decreased width of the spacer fins 212a. In some embodiments, the spacer layer 226 includes a hard mask material, such as silicon oxide, silicon nitride, or silicon oxynitride. Forming the spacer layer 226 includes using a deposition process, such as a CVD or a PVD process.

The method 100 proceeds to step 116 by performing an etch back process to remove the second spacer layer disposed over top of the spacer fin and over the substrate. Referring now to FIGS. 8A (top view) and 8B (cross sectional view), the second spacer layer 226 is removed, except from the sidewalls of the spacer fins 212a. In the present embodiments, the second spacer layer 226 disposed over top of the spacer fins 212a and over the surface of layer 206 (not occupying by the spacer fins 218a) are removed using an etch back process and/or a cleaning process. The remaining spacers 212a with spacer layer 226, collectively referred to as second spacer fins 227, have a dimension D3 that is larger than D2 (FIG. 5B).

Figure 9A:
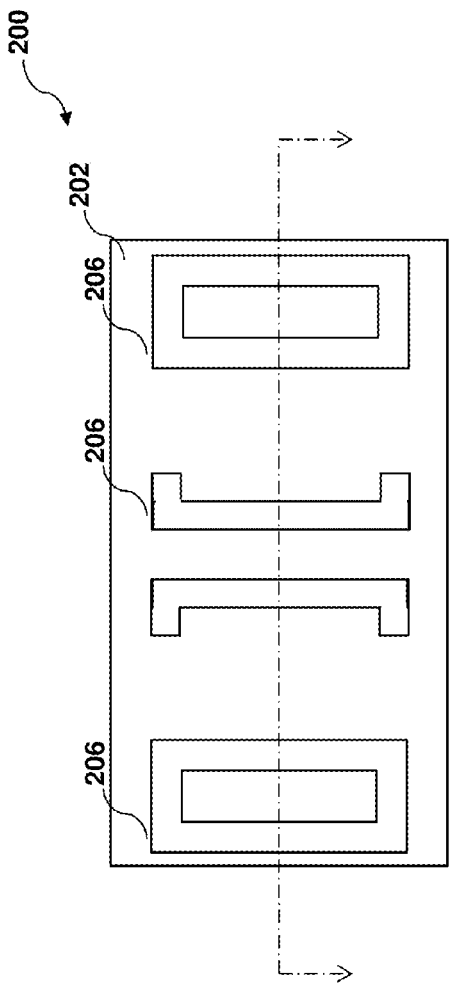
Figure 9B:
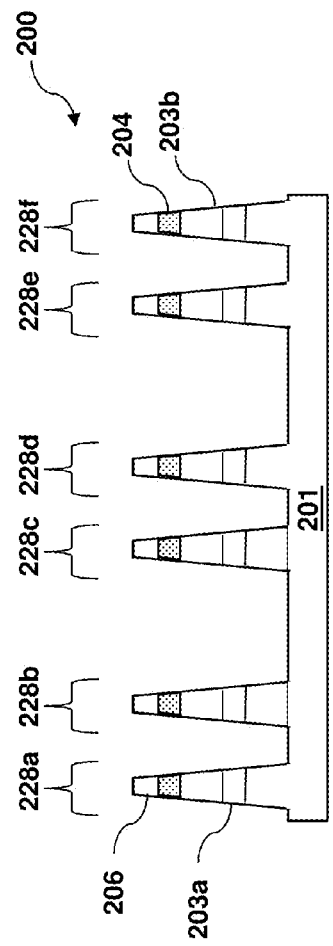

The method 100 proceeds to step 118 by forming a fin stack in the substrate using the second spacer fins as a mask. Referring now to FIGS. 9A (top view) and 9B (cross sectional view), fin stacks 228a-f are formed using the second spacer fins 227 (FIG. 8B) as a hard mask. Forming the fin stacks 228a-f includes using an etching and a cleaning process. In the present embodiments, the fin stacks 228a-f include portions of the semiconductor layer 201, pad oxide layer 203a, SiN layer 203b, the first APF layer 204, and the first capping layer 206. Also in the present embodiment and as shown in the figures, the semiconductor layer 201 is partially etched, so that it extends between and forms part of the fin stacks 228a-f. It is understood that different layers can be used, as a choice of design.

The method 100 proceeds to step 120 by performing a second fin cut process to form a plurality of fin structures and a plurality of dummy fins. In the present embodiments, the first fin cut process is considered a fine cut process, and the second fin cut process is considered a coarse cut process. Performing the second fin cut process also includes using a lithography process and/or cleaning process. Referring now to FIGS. 10A (top view) and 10B (cross sectional view), a second resist pattern 230 is formed to protect the fin stacks 228c and 228d. Portions of the remaining, unprotected fin stacks, i.e., fin stacks 228a, 228b, 228e, and 228f, are removed or "cut" during the second fin cut process. The remaining portions of protected, or un-cut fin stacks 228c and 228d remain, and the unprotected and cut fin stacks 228a, 228b, 228e, and 228f now serve as dummy fins.

In the present embodiments, because a spacer fin was removed in the first fin cut process (step 112), the second resist pattern 230 has a relatively large overlay error margin, as compared to the first fin cut process.

Figure 11A:
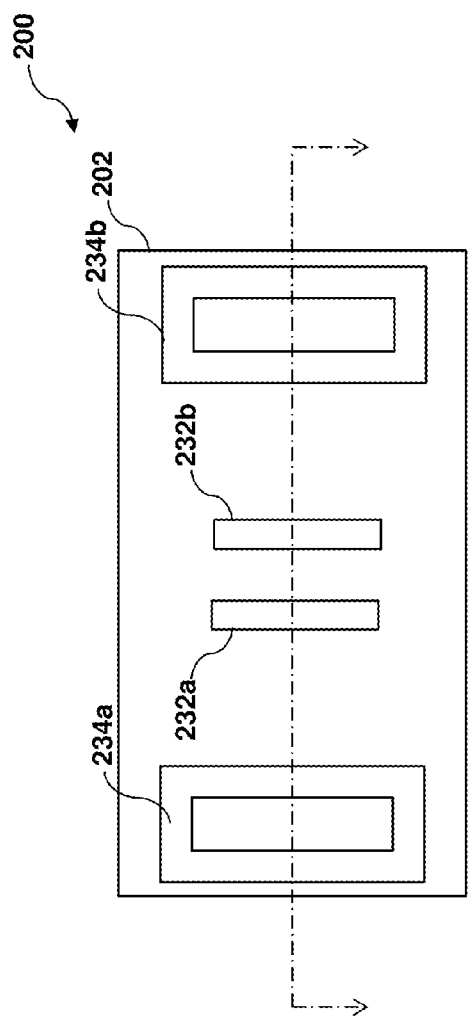
Figure 11B:
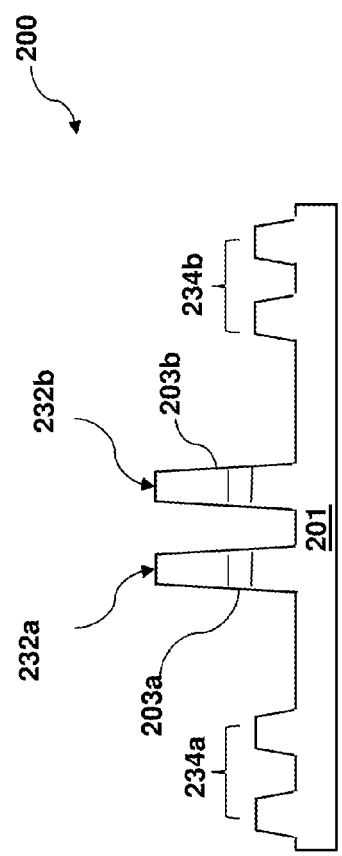

Referring to FIGS. 11A (top view) and 11B (cross-sectional view), in some embodiments, an additional material-removing process can be used to remove material from one or more of the fin stacks 228a-228f (FIG. 10B). For example, and as shown in the figures, the first APF layer 204, and the first capping layer 206 are removed from the fin stacks 228c and 228d, thereby forming fin structures 234a and 234b, respectively. This can be done using an etch process and/or an ion-trim process. The dummy fins 228a-b and 228e-f can also have material removed, thereby forming dummy structures 234a and 234b. As shown in FIGS. 11A and 11B, dummy structure 234a is adjacent to fin structure 232a, and dummy structure 234b is adjacent to fin structure 232b.

In the present embodiment, the dummy fins 234a and 234b reduce a strain built over the substrate by displacing more fin-like structures in a non-active or non-circuit area. The dummy fins 234a and 234b also improve CD (critical dimension) uniformity of fin structures by reducing CD variation of an edge fin compared to a center fin.

The method 100 proceeds to step 122 by forming an isolation structure embedding the fin structures disposed over the substrate. Referring now to FIGS. 12A (top view) and 12B (cross sectional view), an isolation structure 236 is formed over the base substrate 202 with the fin structures 232a and 232b embedded into the isolation structure 236 and the dummy fins 234a and 234b buried into the isolation structure 236. In some embodiments, the isolation structure 236 includes silicon oxide, silicon nitride, silicon oxynitride, or combination thereof. Forming the isolation structure 236 may include using a deposition process, such as a CVD or PVD process, and further include a recess etching process, or a CMP process.

In the foregoing discussion, by fabricating a device, various processes, such as a film deposition process, a lithography process, an etching process, an ion implantation process, a CMP process, and a cleaning process, are performed. In the present embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film over a wafer substrate, exposing the resist film deposited over the wafer substrate by an optical lithography tool or an electron beam writer, and developing the exposed resist film to form a resist pattern for an ion trim process or an etching process. In the present embodiment, a resist is also referred to as a photo resist. A resist may include a positive resist or a negative resist. A resist film may include a single layer resist film or a multiple layer resist film.

One way of coating the resist film over the wafer substrate includes performing a dehydration process before applying the resist film over the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. A different way may also include a soft bake (SB) process to drive a solvent out of a resist film and increase mechanical strength of a resist film. Another alternative way may include applying an antireflective coating, such as a bottom antireflective coating (BARC) or a top antireflective coating (TARC).

Exposing the resist film deposited over the wafer substrate includes using an optical exposing tool or a charged particle exposing tool. The optical lithography tool may include an I-line, a deep ultraviolet (DUV), an extreme ultraviolet (EUV) tool, or an ArF tool. The charged particle exposing tool includes an electron beam or an ion beam tool. The using the optical exposing tool includes using a mask. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film may include a post exposure bake (PEB), a post develop bake (PDB) process, or a combination thereof.

The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

The present disclosure provides multiple embodiments for fabricating a semiconductor device. In one embodiment, a method for fabricating a semiconductor device includes receiving a substrate having a first dummy pattern and depositing a first spacer layer over the first dummy pattern. The first spacer layer is removed, except from sidewalls of the first dummy pattern, to form first spacer fins. The method further includes performing a first fin cut process to remove at least one of the first spacer fins. After the first fin cut process, a second spacer layer is deposited over the remaining first spacer fins. The method further includes removing the second spacer layer, except from sidewalls of the remaining first spacer fins. After removing the second spacer layer, fin stacks are etched, using the remaining first spacer fins. A second fin cut process is performed to modify some, but not all, of the fin stacks, thereby forming fin structures and dummy fins.

In another embodiment, a method of forming a semiconductor device includes receiving a substrate having a plurality of layers and forming a dummy mandrel layer over the substrate, and a hard mask layer over the dummy mandrel layer. The method also includes forming hard mask patterns using the hard mask layer and depositing a first spacer layer over the hard mask patterns. The method also includes forming spacer fins and performing a first fin cut process to remove at least one of the spacer fins. The method includes depositing a second spacer layer over the spacer fins and performing an etching process to form a fin stack using the spacer fins. A second fin cut process is used to cut some, but not all, of the fin stacks. The hard mask patterns includes a first width D1; the spacer fins including a second width D2, and the spacer fins with the second spacer have a third width D3, such that D2<D3<D1.

In yet another embodiment, a method of forming a fin structure of a semiconductor device includes providing a substrate, creating a mandrel pattern over the substrate, depositing a first spacer layer over the mandrel pattern, and removing portions of the first spacer layer to form a first plurality of spacer fins. The method also includes performing a first fin cut process to remove a subset of the first plurality of spacer fins, depositing a second spacer layer over the unremoved first plurality of spacer fins, and removing portions of the second spacer layer to form a second plurality of spacer fins. The method further includes forming a plurality of fin structures, and performing a second fin cut process to remove a subset of the plurality of fin structures.

In another embodiment, the method includes receiving a substrate having an etch stop layer deposited over the substrate, a first spacer layer deposited over the etch stop layer, and a hard mask layer deposited over the first spacer layer, forming a plurality of hard mask patterns using the hard mask layer, wherein the hard mask patterns pattern includes a first dimension adjusted by a predetermined value, depositing a first spacer layer over the hard mask patterns, wherein the first spacer layer includes a first thickness adjusted by the predetermined value, forming a plurality of spacer fins in the first spacer layer by using the hard mask patterns, wherein the spacer fins include a second dimension, a first space, and a second space, performing a first fin cut process to remove at least one spacer fin, adjusting the second dimension to a target dimension, executing an etching process to form a fin stack using the spacer fin, and forming a fin structure surrounded by a plurality of dummy fins over the substrate by performing a second fin cut process. The method further includes forming an isolation structure over the substrate, wherein the isolation structure embeds the fin structure. Forming the isolation structure further includes burying the dummy fins. The first dimension is a function of the first space. The first thickness is a function of the second dimension. The first space is equal to the second space. Adjusting the second dimension includes depositing a second spacer layer over the spacer fins, wherein the second spacer layer includes a second thickness. Adjusting the second dimension further includes depositing the third pacer layer over sidewall of the spacer fins. The second thickness is controlled by a predetermined value. Adjusting the second dimension further includes removing the second spacer layer disposed over top of the spacer fins.

In another embodiment, a method includes receiving a substrate having a plurality of layers, depositing an etch stop layer over the substrate, a first spacer layer over the etch stop layer, and a hard mask layer over the first spacer layer, forming a plurality of hard mask patterns using the hard mask layer, wherein the hard mask patterns includes a first dimension adjusted by a predetermined value, depositing a first spacer layer over the hard mask patterns, wherein the first spacer layer includes a first thickness adjusted by the predetermined value, forming a plurality of spacer fins including a space and a width by using the hard mask patterns, wherein the space is a function of the first dimension and the width is a function of the first thickness, performing a first fin cut process to remove at least one spacer fin, adjusting the width to a target dimension by depositing a second spacer layer over the spacer fins, wherein the second spacer layer includes a second thickness determined by the predetermined value, performing an etching process to form a fin stack using the spacer fins, and forming a fin structure surrounded by a plurality of dummy fins in the substrate by performing a second fin cut process. The plurality of layers includes silicon oxide, silicon nitride, silicon oxynitride layer, or combination thereof. The etch stop layer includes silicon oxide, silicon nitride, silicon oxynitride layer, or combination thereof. The hard mask layer includes silicon oxide, silicon nitride, silicon oxynitride layer, or combination thereof. The first spacer layer includes silicon oxide, silicon nitride, silicon oxynitride, or combination thereof. The first spacer layer includes silicon oxide, silicon nitride, silicon oxynitride, or combination thereof. The second spacer layer includes silicon oxide, silicon nitride, silicon oxynitride, or combination thereof.

In another embodiment, a method includes receiving a substrate having a plurality of layers, depositing an etch stop layer over the substrate, a first spacer layer over the etch stop layer, and a hard mask layer over the first spacer layer, forming a plurality of hard mask patterns using the hard mask layer, wherein the hard mask patterns includes a first dimension increased by a predetermined value, depositing a first spacer layer over the hard mask patterns, wherein the first spacer layer includes a first thickness decreased by the predetermined value, transferring the hard mask patterns into the first space layer to form a plurality of spacer fins including a space and a width, wherein the space is increased by the predetermined value and the width is decreased by the predetermined value, performing a first fin cut process to remove at least one spacer fin by using a first resist pattern, adjusting the width to a target dimension by depositing a second spacer layer over the spacer fins, wherein the second spacer layer includes a second thickness determined by the predetermined value, performing a second fin cut process by using a second resist pattern, and forming the fin structure surrounded by a plurality of dummy fins. The method further includes performing an anisotropic etching process to remove the second spacer layer disposed over top of the spacer fins. Forming the fin structures includes using an etching process to transfer the spacer fins into the substrate.

The present disclosure also provides multiple embodiments of a semiconductor device. In one embodiment, a semiconductor device includes a substrate, a first fin structure, and a second fin structure. The device also includes a first dummy fin structure adjacent to the first fin structure, and a second dummy fin structure adjacent to the second fin structure. The device further includes an isolation layer over the substrate and the first and second dummy fin structures, and surrounding the first and second fin structures. The first and second fin structures are spaced at a distance D1, and the first dummy fin structure is spaced from the first fin structure by a distance D2, such that D1<D2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   receiving a substrate having a first dummy pattern;
   depositing a first spacer layer over the first dummy pattern;
   removing the first spacer layer, except from sidewalls of the first dummy pattern to form first spacer fins;
   performing a first fin cut process to remove at least one of the first spacer fins;
   after the first fin cut process, depositing a second spacer layer over the remaining first spacer fins;
   removing the second spacer layer, except from sidewalls of the remaining first spacer fins;
   after removing the second spacer layer, etching fin stacks using the remaining first spacer fins; and
   performing a second fin cut process to modify some, but not all, of the fin stacks, thereby forming fin structures and dummy fins.

2. The method of claim 1, further comprising forming an isolation structure over the substrate, wherein the isolation structure embeds the fin structures.

3. The method of claim 2, wherein forming the isolation structure buries the dummy fins.

4. The method of claim 1, wherein a location of a removed first spacer fin is positioned between a modified fin stack and an un-modified fin stack.

5. The method of claim 1, wherein the step of receiving a substrate having a first dummy pattern includes receiving a substrate having a dummy mandrel pattern.

6. The method of claim 1, wherein the substrate includes layers of silicon, amorphous carbon (APF), and silicon oxynitride.

7. The method of claim 5, wherein patterns in the dummy mandrel pattern are larger than fins in the first plurality of spacer fins.

8. The method of claim 1, wherein the second fin cut process results in a sequence of a modified fin stack, a space resulting from a removed spacer fin from the first plurality of spacer fins, and an unmodified fin stack.

9. The method of claim 7, wherein the fin structures include layers of silicon, amorphous carbon (APF), and a capping layer.

10. The method of claim 9, wherein the capping layer is silicon oxynitride.

11. A method of forming a semiconductor device, the method comprising:
    receiving a substrate having a plurality of layers;
    forming a dummy mandrel layer over the substrate, and a hard mask layer over the dummy mandrel layer;
    forming hard mask patterns using the hard mask layer, wherein the hard mask patterns includes a first width D1;
    depositing a first spacer layer over the hard mask patterns;
    forming spacer fins including a second width D2 by using the hard mask patterns, wherein the second width D2 is less than the first width D1;
    performing a first fin cut process to remove at least one of the spacer fins;
    depositing a second spacer layer over the spacer fins, wherein a width of the spacer fins with the second spacer layer is a third width D3 such that D2<D3<D1;
    performing an etching process to form fin stacks using the spacer fins; and
    performing a second fin cut process to cut some, but not all, of the fin stacks.

12. The method of claim 11, wherein the plurality of layers include silicon oxide, silicon nitride, silicon oxynitride layer, or combination thereof.

13. The method of claim 11, wherein the fin stacks include silicon.

14. The method of claim 11, wherein the hard mask layer includes silicon oxide, silicon nitride, silicon oxynitride layer, or combinations thereof.

15. The method of claim 11, wherein the dummy mandrel layer includes silicon oxide, silicon nitride, silicon oxynitride, or combinations thereof.

16. The method of claim 11, wherein the first spacer layer includes silicon oxide, silicon nitride, silicon oxynitride, or combinations thereof.

17. The method of claim 11, wherein the dummy mandrel includes polysilicon, amorphous carbon, or photo resist, and wherein the second spacer layer includes silicon oxide, silicon nitride, or silicon oxynitride.

18. A method of fabricating a semiconductor device, the method comprising:
   forming a first dummy pattern on a substrate;
   forming first spacer fins from the first dummy pattern;
   performing a first fin cut process to remove at least one of the first spacer fins;
   after the first fin cut process, depositing a second spacer layer over the remaining first spacer fins;
   removing the second spacer layer, except from sidewalls of the remaining first spacer fins;
   after removing the second spacer layer, etching fin stacks using the remaining first spacer fins; and
   performing a second fin cut process to modify some, but not all, of the fin stacks.

19. The method of claim 18, wherein the substrate includes silicon, and wherein the first spacer fins include silicon.

20. The method of claim 18, wherein the fin stacks include amorphous carbon and silicon oxynitride.

* * * * *